ELECTRICAL COMPONENT CARRIER

Filed Aug. 29, 1963 3 Sheets-Sheet 1

May 3, 1966 S. R. DAWSON ETAL 3,249,819

ELECTRICAL COMPONENT CARRIER

Filed Aug. 29, 1963 3 Sheets-Sheet 2

United States Patent Office 3,249,819

Patented May 3, 1966

3,249,819

ELECTRICAL COMPONENT CARRIER

Stanley R. Dawson, Norwalk, and Roger W. Jones, Garden Grove, Calif., assignors to North American Aviation Inc.

Filed Aug. 29, 1963, Ser. No. 305,429
6 Claims. (Cl. 317—101)

This invention relates to a structure for carrying electrical components; and more particularly to a carrier that holds the components during aging, shipping, testing, and storage.

Many present-day devices are of the type that must be extremely reliable; that is, they must operate prefectly every time. Examples of such high-reliability devices are computers, vote-counting machines, navigation systems, and other systems used by the Armed Forces.

Since progressively more of these systems are using electronic circuits, each electronic component that forms part of the circuitry must therefore also be extremely reliable. However, the present trend toward miniaturization requires that these electronic components be made ever smaller, lighter, and replaceable by other supposedly identical components. Unfortunately however, this very trend toward miniaturization makes these components more susceptible to inherent variation; and to damage by repeated handlings, jouncing during packing and shipment, and bumping encountered during storage.

It is therefore desirable to provide a component carrier into which a plurality of components are inserted; these components remaining in the carrier during aging, testing, shipping, and storage; and being removed from the component carrier only at the time of installation.

In this way repeated handling of the components is avoided; and the carrier-and-component assembly may be packed in a cushioned manner to minimize jouncing and bumping during shipping and storage.

While many component carriers have been proposed, none have been completely satisfactory. Some have been expensive; others have lacked the mechanical rigidity necessary for automated operations; and still others have not withstood repeated trips through the aging and testing machinery. However, the most disturbing fault of many component carriers is their inability to provide correct measurement results.

It is therefore the principal object of the invention to provide an improved component carrier. The attainment of this object and others will be realized from the following specification, taken in conjunction with the drawings of which FIGURE 1 shows a system in clock diagram for testing and measuring the operation of a component;

INTRODUCTION

For convenience, the following explanation will at times be conducted in terms of a type of electronic component known as a resistor; although it should be understood that the resistor merely exemplifies one of the various types of electronic components that may be used—others being transistors, diodes, capacitors, networks, etc.

Generally speaking, an electronic component has electrical conductors referred to as leads for conducting current to and from the component.

In the testing of the electronic components, they are generally connected, by means of their leads to a stimulus circuit that causes a predetermined electric current to flow through the component. In order to determine the operation of the component, a measuring circuit is simultaneously attached to the leads. In this way the component may be operated under predetermined conditions and a measurement may be made of its operation under these predetermined conditions. This procedure permits the operator, or automatic testing equipment, to determine whether the component is operating properly and to identify those components which do not.

Figure 1:
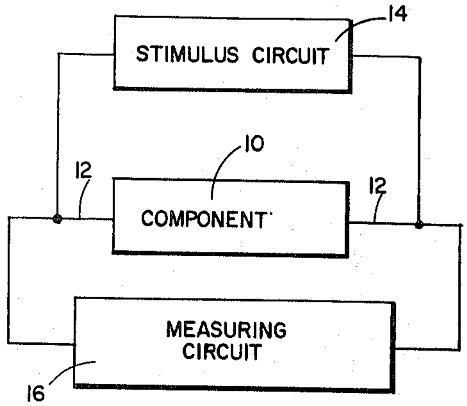

FIGURE 1 shows one way in which a component may have its operation measured. Here component 10 has its leads 12 connected to a stimulus circuit 14 that causes current to flow through the component.

In order to measure the operating characteristics of component 10, a measuring circuit 16 is also connected to the leads 12, either in parallel as shown, or in series.

It may be desirable to periodically re-test the component, particularly those components used in high-reliability programs, to assure that only minimal permissible changes have taken place over an extended period of time. Rather than storing the individual components in a box, and handling them individually for each test, they are preferably poistioned in a component carrier and the carrier-and-component assembly is stored as a unit.

Prior-art component carriers generally had a stick-like configuration, and comprised of a series of interlocking plastic wafers whose edge portions had spring clamps adapted to hold and make electrical contact with the leads of the components portions of the spring-clamps acting as electrical terminals.

In use, the stick-like component carrier is fed into an automated testing mechanism, and is moved or stepped along so that suitably poistioned brush-type contacts of the testing mechanism make electrical connection with terminals of the wafers in succession, in order to operate and measure the operation of sequentially positioned components.

While this arrangement was fairly satisfactory, it had many disadvantages. First of all, in the interests of cleaning, salvaging, and repairing the stick-like component carrier, its wafers were bolted together rather than cemented. The overall assembly was therefore not very rigid and it therefore tended to twist. As a result, when the carrier-and-component assembly was inserted into the automatic testing mechanism, the slight twist frequently caused jamming, or else caused some of the terminals of the component carrier to miss contact with the brushes of the testing mechanism. A second disadvantage was that the plastic wafers, because of their interlocking design, tended to be fragile and difficult to mold. A third disadvantage was that the teeth of the stepping mechanism engaged the plastic wafers, which tended to crack and break because of their limited strength, thus impairing the positive stepping movement required.

Figure 2:
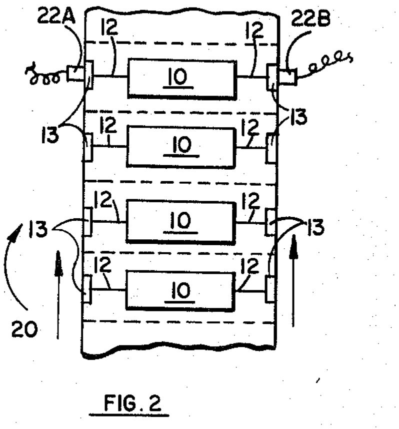
FIGURE 2 shows components mounted on a typical prior art component carrier.

An even more important disadvantage was a technical one, which will be understood from FIGURE 2 showing a prior-art component carrier 20 comprising wafers indicated by dotted lines, and having a plurality of components 10 mounted thereon. As component carrier 20 moves step-wise in an upward direction as indicated by the arrows, sequentially positioned components arrive at the test station, where their leads 12 are connected, by the electrical terminals 13, to brushes 22 of the automated testing mechanism.

It is well known in the electronics art that in practice a perfect insulator does not exist. All insulating materials actually permit the flow of a finite current referred to as leakage current.

It will be seen from FIGURE 2 that current may leak from brush 22A to brush 22B through the wafer itself. In addition, another leakage current may pass from brush 22A to the lead of the component under test, through the interface between adjacent wafers to the lead of the adjacent component, through the second component to its lead, through the wafer back to the lead of the component under test, and thus to brush 22B. In this way the brushes conduct current passing through more than one component. When it is recalled that there may be fifty or one hundred components mounted on a component carrier, it will be appreciated that leakage current through each component affects the testing of all others.

It has been found that in order to avoid the disadvantages introduced by leakage currents, each insulator component, and each of its insulated leads should be separated from adjacent ones by a sheet of conductive material connected to a source of reference potential or ground. Similarly the insulated spring clamps and terminals that contact each lead of a component should also be separated from each other by a sheet of conductive material connected to the source of reference potential or ground. These sheets of conductive material, referred to hereinafter as electrical guards, should be electrically connected together as well as to ground.

A more complete discussion of the use of guards and measurements in a three-terminal network will be found in "Precise Measurement of Small Capacitances," A. M. Thompson, IRE Transactions on Instrumentation, December 1958, vol. PGI, pages 245–253, and "Bridge Techniques in Temperature Measurements," D. G. Gimpel, Applications Bulletin #2 of the Winsco Co., Los Angeles, Califorina.

In order to introduce the guard concept into the wafer-type component carrier, it became necessary to place sheets of metal between adjacent wafers, and to place a longitudinal sheet of metal along the center of the component carrier. This requirement increased the number of elements in each component carrier, and unduly increased its complexity and cost. It also introduced still other problems, such as disassembly for cleaning.

Prior-art wafer-type component carriers had still another disadvantage. Components are made in various capacitances, resistances, etc., to operate under different conditions. As a result, their lengths vary from one type of component to another.

Prior-art wafer-type component carriers could not accommodate components of a different size; i.e., it was necessary to have component carriers of various widths. This meant that a large number of different-width component carriers had to be available.

The present invention contemplates a rigid component carrier that inherently provides an electrical guard between adjacent leads and between the separate leads of the same component. This result is achieved by the use of grounded conductive partitions that function as guards between adjacent leads. These partitions are integral parts of a mechanically strong, electrically conductive, backbone; and adjacent partitions form compartments that receive solid cells of plastic which in turn receive the component leads. Each cell contains at least one spring that contacts the lead inserted into it and provides an electrical terminal.

Two of the above-described backbone-and-cell assemblies are spaced apart by an electrically-conductive spacing-block, that functions to provide not only proper spacing but also an electrical guard between leads of a given component.

DESCRIPTION OF THE INVENTION

Figure 3:
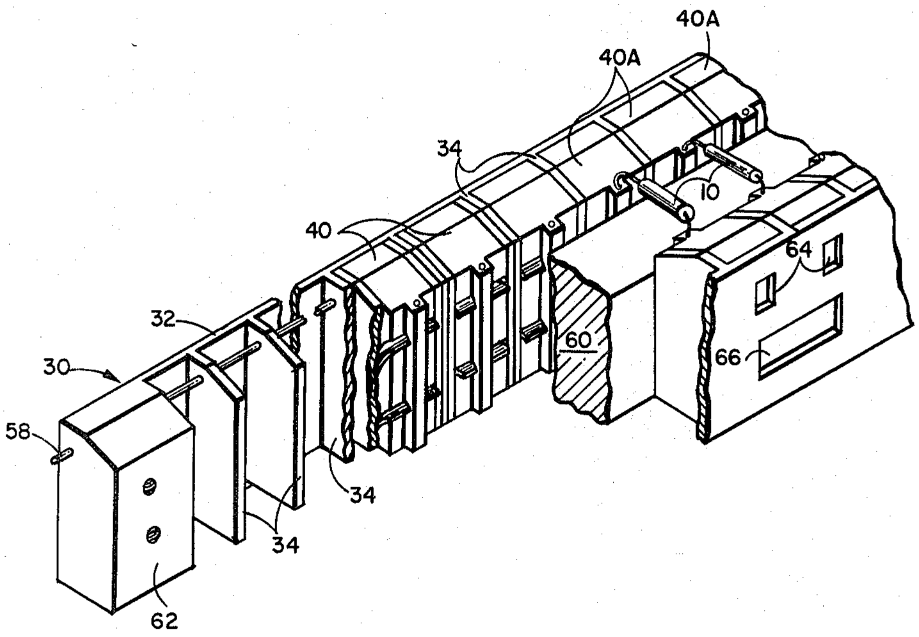
FIGURE 3 shows a perspective view of the present invention partly broken away.

The basic concept of the present invention is shown in FIGURE 3. Here component carrier 30 comprises a backbone portion 32 of electrically conductive material that is preferably metallic. Alternatively, it may be a strong plastic (such as a type ABS thermoplastic resin made by Marbon Chemical Division of the Borg-Warner Co.), whose surface has been coated with an electrically conductive material. Backbone 32 comprises spaced-apart partitions 34 that are part of its unitary structure. Thus, backbone 32 forms a rigid, sturdy base for the component carrier 30.

As previously indicated, partitions 34 are spaced apart a predetermined distance, thus forming compartments. A cell is inserted into each compartment to hold the lead of a component, make electrical contact with the lead, and provide a terminal to which contact is made with the brushes of the automated testing mechanism.

Figure 4:
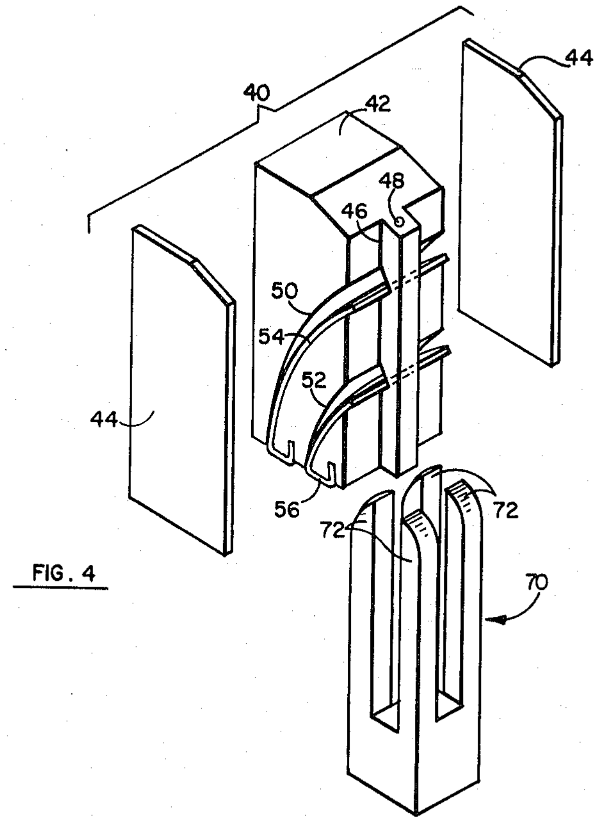
FIGURE 4 shows an enlarged exploded view of a cell and a spring-retracting tool.

FIGURE 4 shows a partially exploded view of a cell 40, which may comprise a central portion 42 and two end plates 44. End plates 44 are flat plastic sheets, suitably shaped; while central portion 42 is a substantially solid block of plastic. As shown, central portion 42 has a protrusion 46 pierced by a longitudinal hole 48, which receives the lead wire of the component.

Central portion 42 also has two suitably shaped recesses 50 and 52 for receiving and retaining springs 54 and 56, the upper ends of which fit into suitably-positioned notches in the back of protrusion 46. The lower ends of the springs are fitted into locking slots as shown.

When cell 40 is assembled, the springs 54 and 56 are inserted into the recesses 50 and 52 as shown, and the end plates 44 are positioned in contiguous relation with the center portion 42. In this way the end plates 44 hold the springs 54 and 56 in the recesses 50 and 52. The assembled cell 40 fits into a compartment formed by two adjacent partitions 34 of the backbone 30, as shown in FIGURE 3. If desired, the end plates 44 may be cemented to the central portion 42 in order to form a permanent cell assembly.

While cell 40 has been shown and illustrated as having end plates, this has been done for ease of explanation. The cell may be a unitary molded structure. Therefore, some of the cells 40A are shown as unitary structures in FIGURE 3.

Each cell fits into a compartment formed by adjacent partitions 34 of the backbone and is held in place by a rod or bolt 58. In that manner the electrically conductive partitions 34 act as electrical guards positioned between the spring clamps that hold the leads of adjacent components.

It is seen that component carrier 30 comprises two similar backbone-and-cell assemblies that are positioned with their cells and partitions facing each other. The component 10 is positioned with its leads in the longitudinal holes of oppositely-disposed cells in electrical contact with the springs thereof.

It may be seen from FIGURE 4 that the bottom portions of springs 54 and 56 are exposed at the bottom of the cells to make contact with suitably positioned brushes of the testing mechanism not shown.

Referring again to FIGURE 3, the two separate backbone-and-cell assemblies are spaced apart by an electrically conductive spacing-block 60, which may be of metal or of plastic with a coating of conductive material.

As noted hereinbefore, spacing-block 60 serves several purposes. First of all, it acts as the electrical guard that isolates the lead at one end of the component from the lead at the other end. Secondly, it provides support for the backbone-and-cell assemblies to form the component carrier into a sturdy, rigid, dimensionally-stable, non-twisting structure. Thirdly, it permits the backbone-and-cell assemblies to be spaced apart any desired distance so that if a larger-sized component is to be used, it is only necessary to substitute a wider spacing-block. This obviates the prior-art necessity for having a large assortment of component carriers of different widths.

It may thus be seen that the component carrier 30 comprises three elements; a first backbone-and-cell assembly, a spacing block 60, and a second backbone-and-cell assembly. These are held together by any suitable means, as for example by bolts that pass through end-portions 62 to hold together the three elements that comprise component carrier 30. This bolting arrangement through end-portions 62 has the additional advantages that it is easy to assemble or disassemble; and the electrically-conductive bolts assure that the electrically conductive backbones and electrically conductive spacing-block are at the same electrical potential to act as electrical guards.

Each backbone 32 is provided with a series of slots, 64, which may be engaged by a sprocket of the stepping mechanism not shown, in order to move the component carrier one cell at a time past contact brushes. It will be noted that the slots 64 are in the metal backbone, and are therefore extremely strong and precisely spaced.

If desired, a recess 66 is provided to receive an identification label which may, if desired, contain magnetically coded information for identification and use by the testing mechanism.

It will be noted from FIGURE 4 that the springs at the bottom of each cell provide two separate terminals that are in independent electrical contact with the same lead of the component. Thus, as the component carrier of FIGURE 3 is moved along under the influence of the stepping mechanism, sets of four aligned contacts appear in succession at the test station. The two left-most contacts on one cell are electrically connected to the left-most lead of the component; the two right-most contacts of the oppositely disposed cell are electrically connected to the right-most lead of the same component. Contact brushes may be provided at the test station to make electrical connections with the aligned contacts as required. Since the bottom of the spacing block 60 is electrically connected to all the partition-guards 34 through the conductive bolts and backbone, a fifth brush may make a continuous contact with all of the partition-guards in order to continuously connect them to ground.

It will be noted that the leads of the component are held by the ends of the spring clamps of the component carrier, and that the body of the component is thus held securely. The body of the component is preferably rested on the spacing block 60, as this assures that each component has the same length of its leads inserted into the holes 48.

It will also be noted that the outline of the component carrier is substantially rectangular, with the components themselves positioned below the uppermost line of the carrier. As a result, the component carrier can be closely stacked or packed.

The present invention thus provides a component carrier that holds the components, provides desired electrical contacts, permits positive stepping, and yet provides a firm structure that can be easily stacked, packed, shipped, and stored. In addition, it may be readily disassembled for cleaning and repair.

In the component carrier cells shown in FIGURE 4, the ends of the springs 54 and 56 bite into the lead wires. The spring contacts should therefore be retracted while inserting and withdrawing the leads of a component. To do that, a spring-retracting tool 70 of FIGURE 4 is provided. In operation, tool 70 is inserted upward into the cell so that adjacent prongs 72 straddle the protrusion 46. As the tool 70 is moved upward, the curved ends of prongs 72 gradually force back the ends of the springs, so that the lead wire may be inserted into longitudinal hole 48. Once the lead wire is suitably inserted, tool 70 is withdrawn; whereupon the ends of the springs move forward, and bite into the lead wire to provide firm electrical and mechanical contact.

Since the entire component carrier is extremely sturdy and dimensionally stable, a multiple pronged retracting tool may be made the same length as the carrier and the carrier may be pressed down onto the tool so that all of the spring contacts are simultaneously retracted. In that manner the entire carrier can be loaded or unloaded at one time.

Some electronic components have three or more leads. To accommodate such components, adjacent cells are so spaced that their longitudinal holes are the correct distance apart to receive the plurality of lead components.

There are times when it is neither desirable nor necessary for the ends of the springs to bite into the leads. Under such conditions, a second embodiment of the invention partially illustrated in FIGURE 5, may be used. It comprises a component carrier 80 basically the same as the one previously described. It has partitions 84 that are similarly spaced to form compartments but a somewhat different backbone 82 having lock-in joints 83 that permit a cell 86 to be snapped into place and rigidly held. Of course, lock-in joints may be incorporated in the first embodiment of FIGURE 3 as well.

The cell 86 comprises a block of suitable plastic that is shaped to snap into the lock-in joints of the backbone 82 and is provided with an internally positoned longitudinal hole 92 for receiving the lead of a component. Suitably shaped recesses 94 and 96 contain springs 98 and 100, the outer surfaces of which press against the lead in the hole 92. Since the springs are recessed, as shown, the partitions cannot come in contact with them.

In operation, the lead of the component is inserted into longitudinal hole 92. When it meets the spring, it forces the near corners of the spring downward to permit the lead wire to pass, the springs flexing at points 102. In this way each spring 98 and 100 contacts the lead. When it is time to unload the component carrier, the lead is withdrawn and the springs snap back to normal positions.

Figure 5:
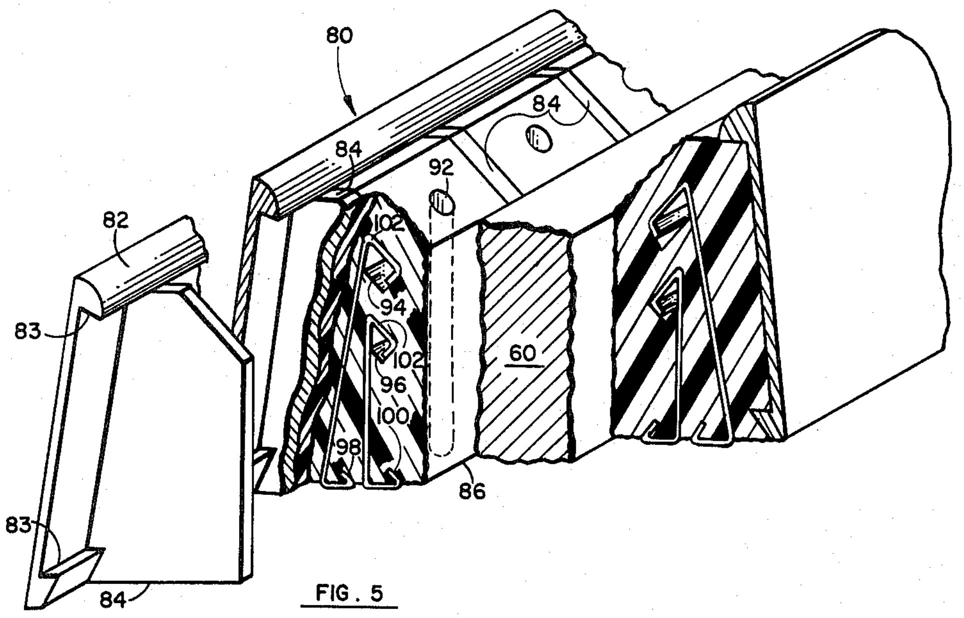
FIGURE 5 shows a second embodiment of the invention.

The component carrier of FIGURE 5 also comprises three major parts, a central spacing block 60 and two outer backbone-and-cell assemblies, that are held together in a suitable manner.

It will be noted that the component carrier of FIGURE 5 is even sturdier than the one previously described, as in this arrangement the spacing block 60 butts firmly against the solid front face of the cells 86 and the partitions 84. Its inwardly inclined backbones prevent the component carrier from being inserted upside-down into the automatic testing mechanism.

Many electronic components have the characteristic that they must be aged before they achieve the necessary operational stability. This aging is accomplished by causing a predetermined electric current to pass through the electronic component for a specified period. As noted hereinbefore, it is undesirable to handle the component excessively and an electronic-component carrier having the previously described advantages may be designed to permit aging as well as testing, shipping, and storage.

Figure 6:
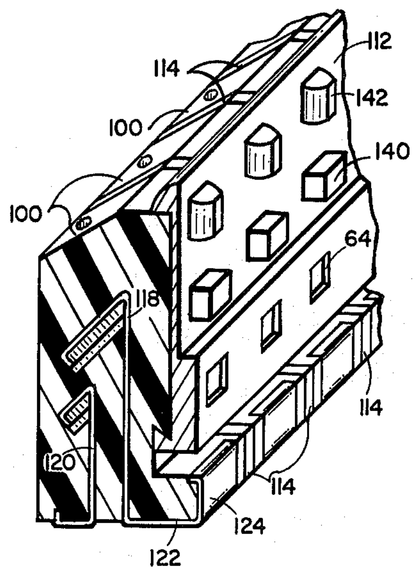
FIGURE 6 shows still another embodiment of the invention.

A backbone-and-cell arrangement of a component carrier for achieving these purposes is shown in FIGURE 6. This is similar to those described with reference to FIGURES 3 and 5 in that it has cells 100, a backbone 112 having guard partitions 114, and spring-contacts 118 and 120. The outermost spring 118 has its lower end bent in such a manner that it wraps around the other portion of the cell thereby forming a bottom terminal 122, and a side terminal 124. The side terminals are used for aging the components as shown in FIGURE 7, which is a symbolic top view of component carriers in an aging frame.

Figure 7:
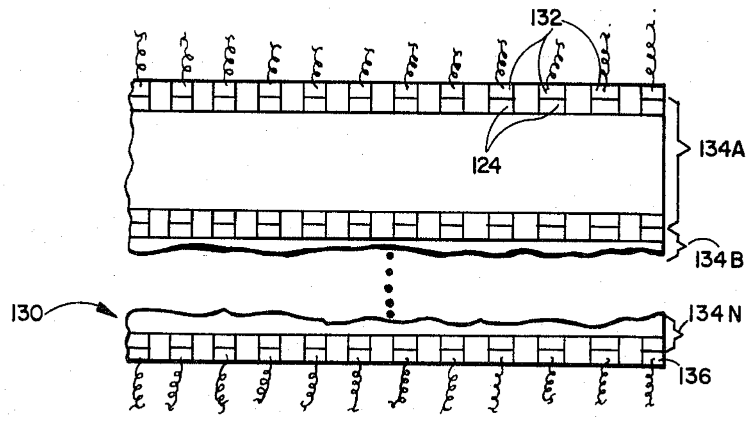
FIGURE 7 illustrates the use of the invention for aging components mounted on the structure of FIGURE 6.

The aging frame of FIGURE 7 has, along the top edge thereof, a series of terminals 132 that are connected by wires to a suitable source of power for the aging operation. A first component carrier 134A is positioned so that its upper side-terminals 124 abut the terminals 132 of the aging frame. A second component carrier 134B is positioned so that its upper side terminals abut the lower side terminals of the carrier 134A. In this way a plurality of component carriers 134A–134N are positioned in the aging frame so that respective side terminals abut, and are therefore in electrical contact.

When the aging frame has been filled to capacity with component carriers, the bottom edge 136 of the aging frame is positioned in place, so that its electrical terminals abut the lower side terminals of the last component carrier 134N. The aging frame is then bolted together; and a suitable source of current is connected to the respective wires of the aging frame. In that way, predetermined current is caused to pass through the various components for the desired period to age the electronic components.

In order to fixedly position the various component carriers, and to assure proper electrical contact between their side terminals, it is preferable that the ends of the component carriers have a guide slot that engages a suitable tongue or ridge on the aging-frame, so that the component carrier cannot move once it is properly positioned.

In the previous discussion it has been indicated that the component carrier is to be moved automatically in a step-wise manner. The previous illustrations have shown sprocket holes that may be used by a suitable indexing mechanism. Under some conditions, it may be desirable to have lugs 140 as shown in FIGURE 6, rather than sprocket holes. Alternatively, some mechanisms use a stepping gear for which gear teeth 142 are provided. The embodiment of FIGURE 6 also has sprocket holes 69 as previously described.

ADVANTAGES

The described component carrier provides two contacts for each lead wire of the component; provides conductive guard partitions between adjacent electrical connections to the lead wires; and provides a guard in the form of a conductive spacing block between the electrical connections to the lead wires of each individual component. The spacing block and the backbone are in firm mechanical contact throughout the entire length of the component carrier; and the guard partitions and spacing block are in good electrical contact, this electrical contact being assured by means such as electrically conductive bolts.

The testing and measuring equipment may incorporate a circuit for electrically grounding the guards; and thus provide more desirable testing and measuring conditions than was provided by prior-art component carriers.

Moreover, the described structure provides easy assembly and disassembly; and easy repair, replacement, and salvage. It additionally provides increased versatility in the handling of different sized components, and requires a minimal number of spare parts.

Furthermore, its sturdiness, non-twisting characteristic, dimensionally-stable structure, presence of metal indexing means, and availability of identification labels assures reliable long-lived operation when used with automated equipment.

Although the invention has been illustrated and described in detail, it is to be clearly understood that the same is by way of illustration and example only and is not to be taken by way of limitation; the spirit and scope of this invention being limited only by the terms of the appended claims.

What is claimed is:

1. A component carrier for holding a plurality of components having leads comprising
- a backbone having spaced apart electrically conductive partitions,
- means electrically connecting said partitions,
- a lead-holding cell positioned between adjacent ones of said partitions, said cell having a longitudinal hole for receiving said lead, and
- means holding said lead in said longitudinal hole of said cell comprising a spring positioned in said cell and adapted to be flexed by said leads moving in said hole, a first portion of said spring holding and making electrical contact with the lead wire in the longitudinal hole of said cell, another portion of said spring being exposed at a surface of said cell.

2. A component carrier for holding a plurality of components having leads comprising
- an electrically conductive backbone having spaced apart electrically conductive partitions;
- means electrically connecting said partitions and said backbone;
- a lead-holding cell positioned between adjacent ones of said partitions, said cell having a longitudinal hole for receiving said lead; and
- means comprising a spring positioned in said cell and adapted to be flexed by said leads moving in said hole, for holding and making electrical contact with the lead wire in the longitudinal hole of said cell, one end of said spring being exposed at the bottom of said cell.

3. A component carrier for holding a plurality of components having leads comprising
- an electrically conductive backbone having spaced apart electrically conductive partitions;
- means electrically connecting said partitions and said backbone;
- a lead-holding cell positioned between adjacent ones of said partitions, said cell having a longitudinal hole for receiving said lead; and
- means, comprising a pair of springs positioned in said cell and adapted to be flexed by said leads moving in said hole, for holding and making electrical contact with the lead in the longitudinal hole of said cell, a portion of each of said springs being exposed at the bottom of said cell.

4. The combination of claim 3 wherein a portion of at least one of said springs is also exposed at the side of said cell.

5. A component carrier for holding a plurality of components having leads comprising
- an electrically conductive backbone having spaced apart electrically conductive partitions;
- means electrically connecting said partitions and said backbone;
- a lead-holding cell positioned between adjacent said partitions, said cell having a longitudinal hole for receiving said leads; and
- means comprising a pair of springs positioned in said cell and adapted to be flexed by said leads moving in said hole, for holding and making electrical contact with the lead in the longitudinal hole of said cell, one end of each of said springs being exposed at the bottom and at the side of said cell.

6. A component carrier for holding a plurality of electronic components having leads comprising
- a first backbone-and-cell assembly including first electrically conductive backbone having spaced apart electrically conductive partitions, means electrically connecting said partitions and said first backbone, a component-lead holding cell positioned between adjacent partitions of said first backbone, said cells having longitudinal holes for receiving leads, and means, comprising a spring positioned in said cells for holding and making electrical contact with the lead wire in the longitudinal hole of said cell and adapted to be flexed by said leads moving in said holes, one end of said spring being exposed at the bottom of said cell, a second backbone-and-cell assembly including a second electrically conductive backbone having spaced apart electrically conductive partitions, means electrically connecting said partitions and said second backbone, a component-lead holding cell positioned between adjacent partitions of said second backbone, each of said cells having a longitudinal hole for receiving a lead, and means comprising a spring positioned in said cells for holding and making electrical contact with the lead wire in the longitudinal hole of said cell and adapted to be flexed by said leads moving in said hole, one end of said spring being exposed at the bottom of said cell, an electrically conductive spacing bar positioned between said first and said second backbones, and means electrically and mechanically connecting said spacing bar and said backbone-and-cell assemblies.

References Cited by the Examiner

UNITED STATES PATENTS

| | | | |
|---|---|---|---|
| 1,421,571 | 7/1922 | Rodger | 74—29 |
| 2,512,138 | 6/1950 | Butt | 317—101 |
| 2,766,435 | 10/1956 | French | 339—17 |
| 2,915,678 | 12/1959 | Frazier et al. | 317—101 |
| 3,054,024 | 9/1962 | Van Dillen et al. | 317—101 |
| 3,121,188 | 2/1964 | Foster | 317—101 |
| 3,188,523 | 6/1965 | Yungkurth | 317—101 |

ROBERT K. SCHAEFER, *Primary Examiner.*

KATHLEEN H. CLAFFY, *Examiner.*

J. J. BOSCO, *Assistant Examiner.*